(12) United States Patent
Hsu et al.

(10) Patent No.: US 11,264,359 B2
(45) Date of Patent: Mar. 1, 2022

(54) CHIP BONDED TO A REDISTRIBUTION STRUCTURE WITH CURVED CONDUCTIVE LINES

(71) Applicant: Taiwan Semiconductor Manufacturing Co., Ltd., Hsinchu (TW)

(72) Inventors: Chia-Kuei Hsu, Hsinchu (TW); Ming-Chih Yew, Hsinchu (TW); Shu-Shen Yeh, Taoyuan (TW); Che-Chia Yang, Taipei (TW); Po-Yao Lin, Zhudong Township (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/028,629

(22) Filed: Sep. 22, 2020

(65) Prior Publication Data

US 2021/0335753 A1 Oct. 28, 2021

Related U.S. Application Data

(60) Provisional application No. 63/015,775, filed on Apr. 27, 2020.

(51) Int. Cl.
*H01L 23/495* (2006.01)
*H01L 23/34* (2006.01)
(Continued)

(52) U.S. Cl.
CPC ...... *H01L 25/0655* (2013.01); *H01L 21/4857* (2013.01); *H01L 21/561* (2013.01);
(Continued)

(58) Field of Classification Search
CPC . H01L 25/0655; H01L 24/20; H01L 21/4857; H01L 21/561; H01L 23/3185;
(Continued)

(56) References Cited

U.S. PATENT DOCUMENTS 9,741,690 B1 * 8/2017 Hsieh ............... H01L 21/56
9,773,753 B1 * 9/2017 Lin ................. H01L 23/5389
(Continued)

*Primary Examiner* — Alonzo Chambliss
(74) *Attorney, Agent, or Firm* — Slater Matsil, LLP

(57) ABSTRACT

An embodiment is package structure including a first integrated circuit die, a redistribution structure bonded to the first integrated circuit die, the redistribution structure including a first metallization pattern in a first dielectric layer, the first metallization pattern including a plurality of first conductive features, each of the first conductive features including a first conductive via in the first dielectric layer and first conductive line over the first dielectric layer and electrically coupled to the respective first conductive via, each of the first conductive lines comprising a curve in a plan view, a second dielectric layer over the first dielectric layer and the first metallization pattern, and a second metallization pattern in the second dielectric layer, the second metallization pattern including a plurality of second conductive via in the second dielectric layer, each of the second conductive vias being over and electrically coupled to a respective first conductive line.

20 Claims, 20 Drawing Sheets

(51) Int. Cl.
*H01L 23/48* (2006.01)
*H01L 21/00* (2006.01)
*H01L 21/44* (2006.01)
*H01L 21/4763* (2006.01)
*H01L 25/065* (2006.01)
*H01L 23/538* (2006.01)
*H01L 21/56* (2006.01)
*H01L 21/48* (2006.01)
*H01L 23/31* (2006.01)
*H01L 23/00* (2006.01)

(52) U.S. Cl.
CPC ...... *H01L 23/3185* (2013.01); *H01L 23/5383* (2013.01); *H01L 23/5386* (2013.01); *H01L 24/20* (2013.01); *H01L 23/3128* (2013.01)

(58) Field of Classification Search
CPC ............. H01L 23/5383; H01L 23/3128; H01L 23/5386
See application file for complete search history.

(56) References Cited

U.S. PATENT DOCUMENTS

| | | | |
|---|---|---|---|
| 10,062,648 B2 * | 8/2018 | Hsieh | .................. H01L 23/5384 |
| 10,629,560 B2 * | 4/2020 | Chen | ....................... H01L 24/24 |

* cited by examiner

CHIP BONDED TO A REDISTRIBUTION STRUCTURE WITH CURVED CONDUCTIVE LINES

PRIORITY CLAIM AND CROSS-REFERENCE

This application claims the benefit of U.S. Provisional Application No. 63/015,775, filed on Apr. 27, 2020, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
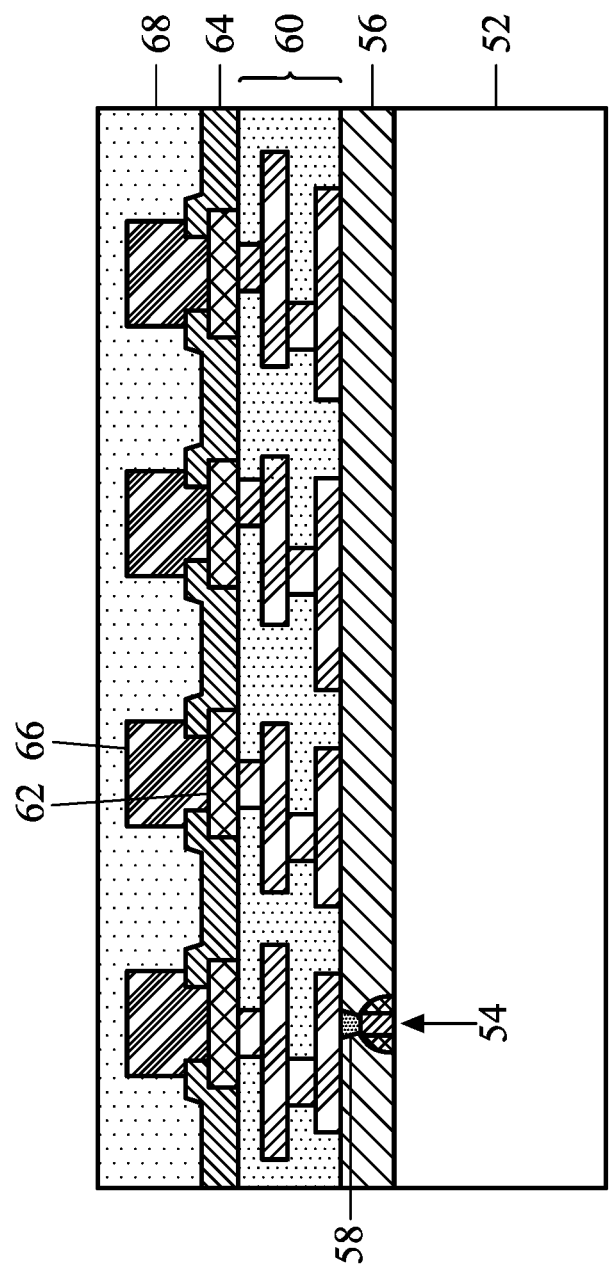
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Redistribution structures including metallization patterns, and methods of forming the same are provided, according to some embodiments. In particular, the redistribution structures include metallization patterns with shapes that provide more flexibility for the metallization pattern to deal with bending and other deformations without breaking. For example, the metallization patterns can have a curved, "C"-like shape or a "U"-like shape in a plan view. Metallization patterns in redistribution structures may bend or deform due to coefficient of thermal expansion (CTE) mismatch of materials in a semiconductor package. This CTE mismatch can cause the metallization patterns to endure high stress due to the bending and deformation. However, the disclosed shapes of the metallization patterns with the increased flexibility increase the reliability of the redistribution structure. These flexibly-shaped metallization patterns are surrounded by conforming dielectric layers, such as polymer layers. The combination of the flexibly-shaped metallization patterns and the surrounding conforming dielectric layers provide a buffer to release the stress in the redistribution structure and the package structure.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side and an inactive surface (e.g., the surface facing downwards in FIG. 1), sometimes called a back side.

Devices (represented by a transistor) 54 may be formed at the front side of the semiconductor substrate 52. The devices 54 may be active devices (e.g., transistors, diodes, etc.), capacitors, resistors, etc. An inter-layer dielectric (ILD) 56 is over the front side of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 18 illustrate cross-sectional views of intermediate steps during a process for forming a first package component 100, in accordance with some embodiments. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages.

Figure 2:
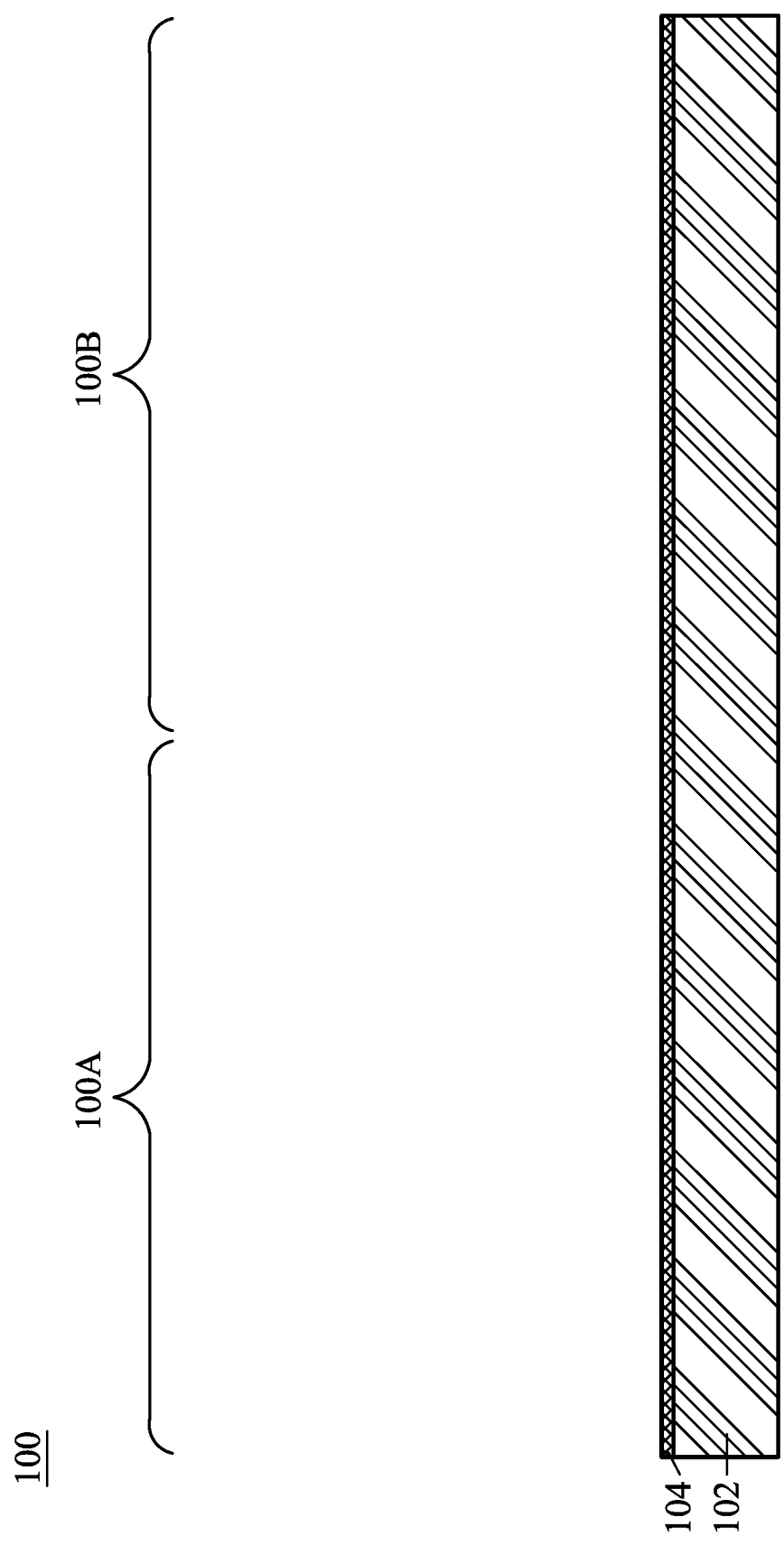
FIGS. 2 through 7 and 10 through 18 illustrate cross-sectional views of intermediate steps during a process for forming a package component in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

In FIGS. 3 through 7, a redistribution structure 120 (see FIG. 7) is formed over the release layer 104. The redistribution structure 120 includes dielectric layers 124, 128, 132, 136, and 140; and metallization patterns 126, 130, 134, and 138. The metallization patterns may also be referred to as redistribution layers or redistribution lines. The redistribution structure 120 is shown as an example having four layers of metallization patterns. More or fewer dielectric layers and metallization patterns may be formed in the redistribution structure 120. If fewer dielectric layers and metallization patterns are to be formed, steps and process discussed below may be omitted. If more dielectric layers and metallization patterns are to be formed, steps and processes discussed below may be repeated.

Figure 3:
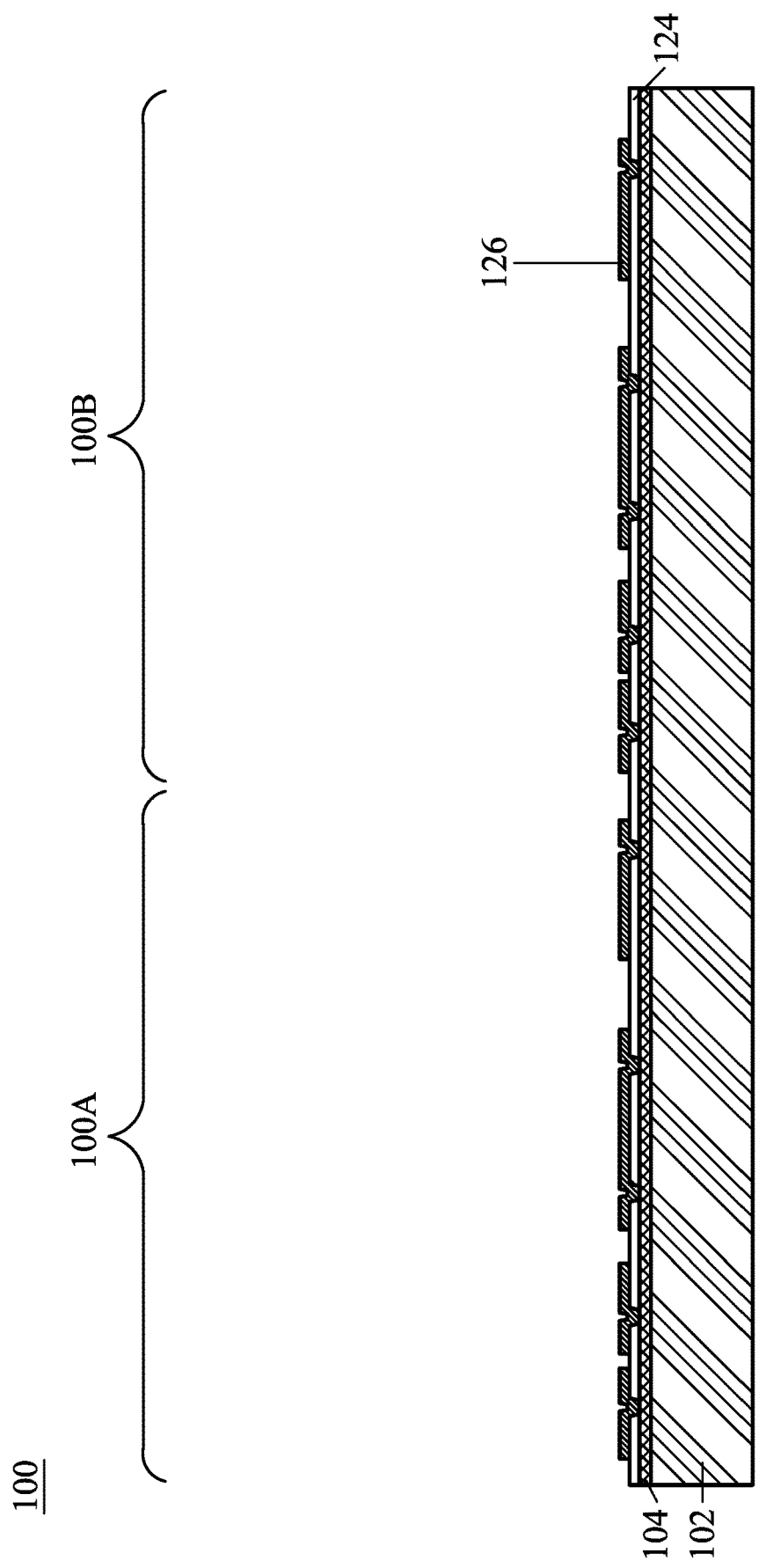

In FIG. 3, the dielectric layer 124 is deposited on the release layer 104. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings exposing portions of the release layer 104. The patterning may be by an acceptable process, such as by exposing and developing the dielectric layer 124 to light when the dielectric layer 124 is a photo-sensitive material or by etching using, for example, an anisotropic etch.

The metallization pattern 126 is then formed. The metallization pattern 126 includes conductive elements extending along the major surface of the dielectric layer 124 and extending through the dielectric layer 124. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 4:
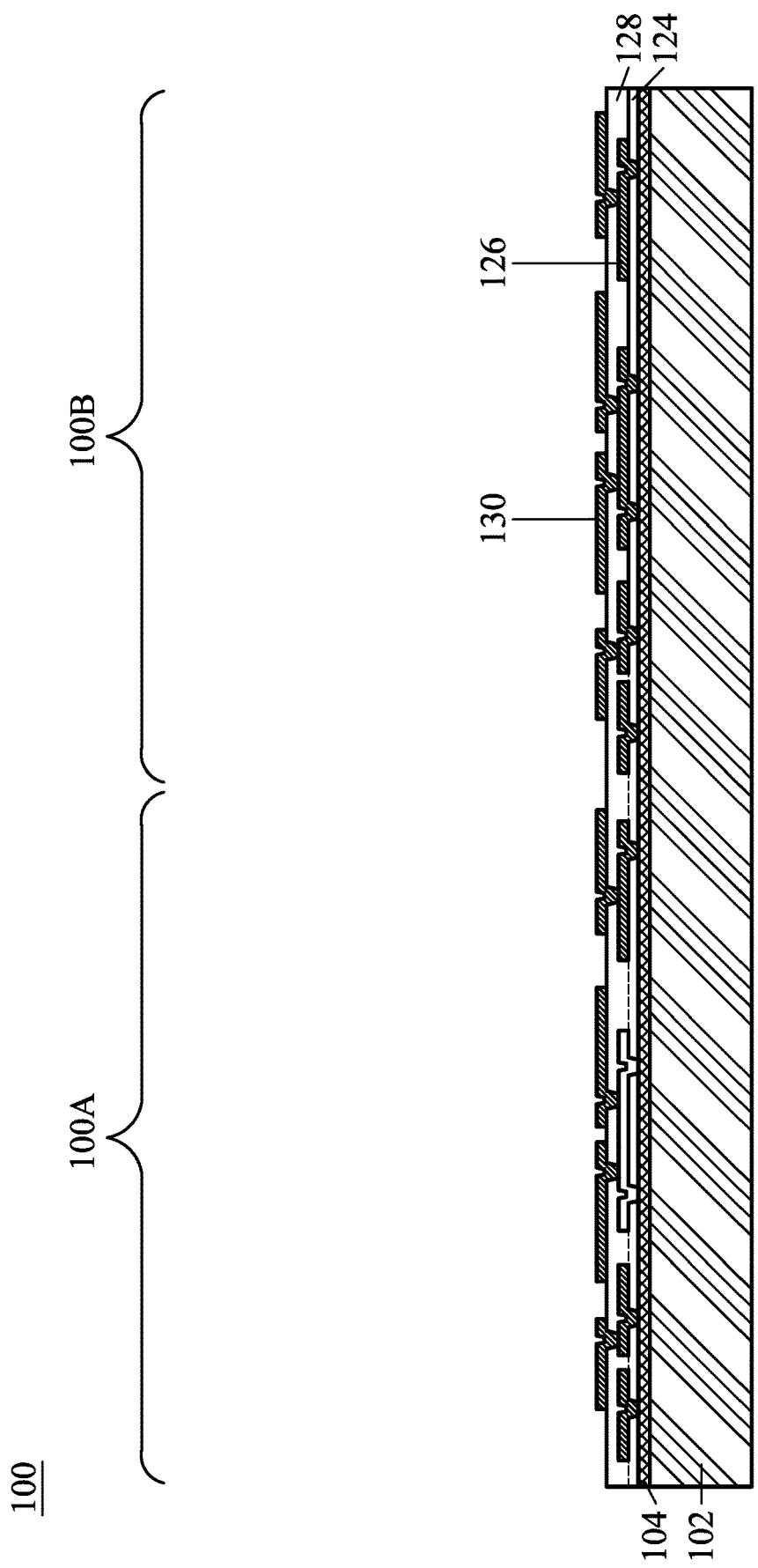

In FIG. 4, the dielectric layer 128 is deposited on the metallization pattern 126 and the dielectric layer 124. The dielectric layer 128 may be formed in a manner similar to the dielectric layer 124, and may be formed of a similar material as the dielectric layer 124.

The metallization pattern 130 is then formed. The metallization pattern 130 includes portions on and extending along the major surface of the dielectric layer 128. The metallization pattern 130 further includes portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

Figure 5:
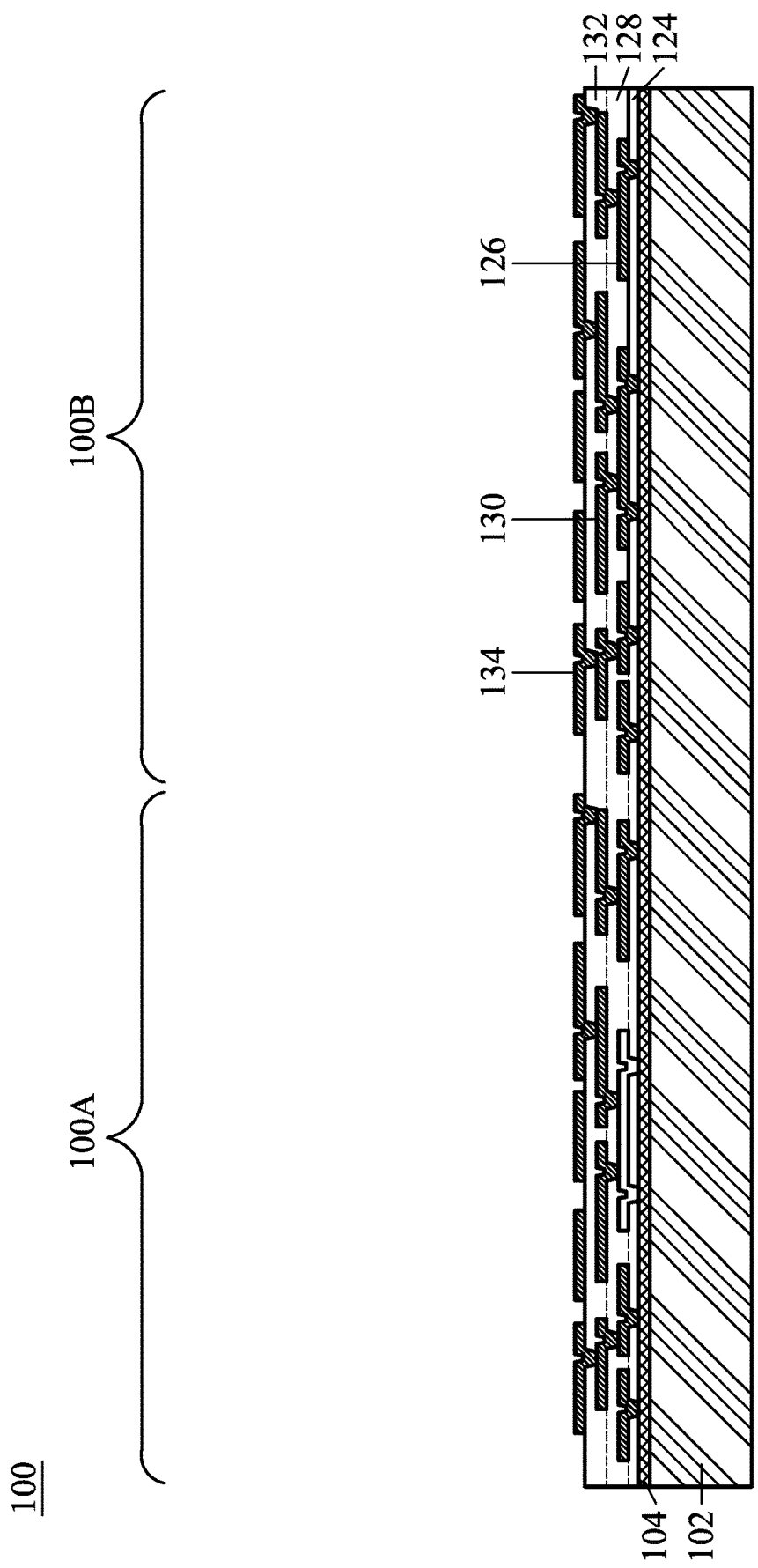

In FIG. 5, the dielectric layer 132 is deposited on the metallization pattern 130 and the dielectric layer 128. The dielectric layer 132 may be formed in a manner similar to the dielectric layer 124, and may be formed of a similar material as the dielectric layer 124.

The metallization pattern 134 is then formed. The metallization pattern 134 includes portions on and extending along the major surface of the dielectric layer 132. The metallization pattern 134 further includes portions extending through the dielectric layer 132 to physically and electrically couple the metallization pattern 130. The metallization pattern 134 may be formed in a similar manner and of a similar material as the metallization pattern 126. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

Figure 6:
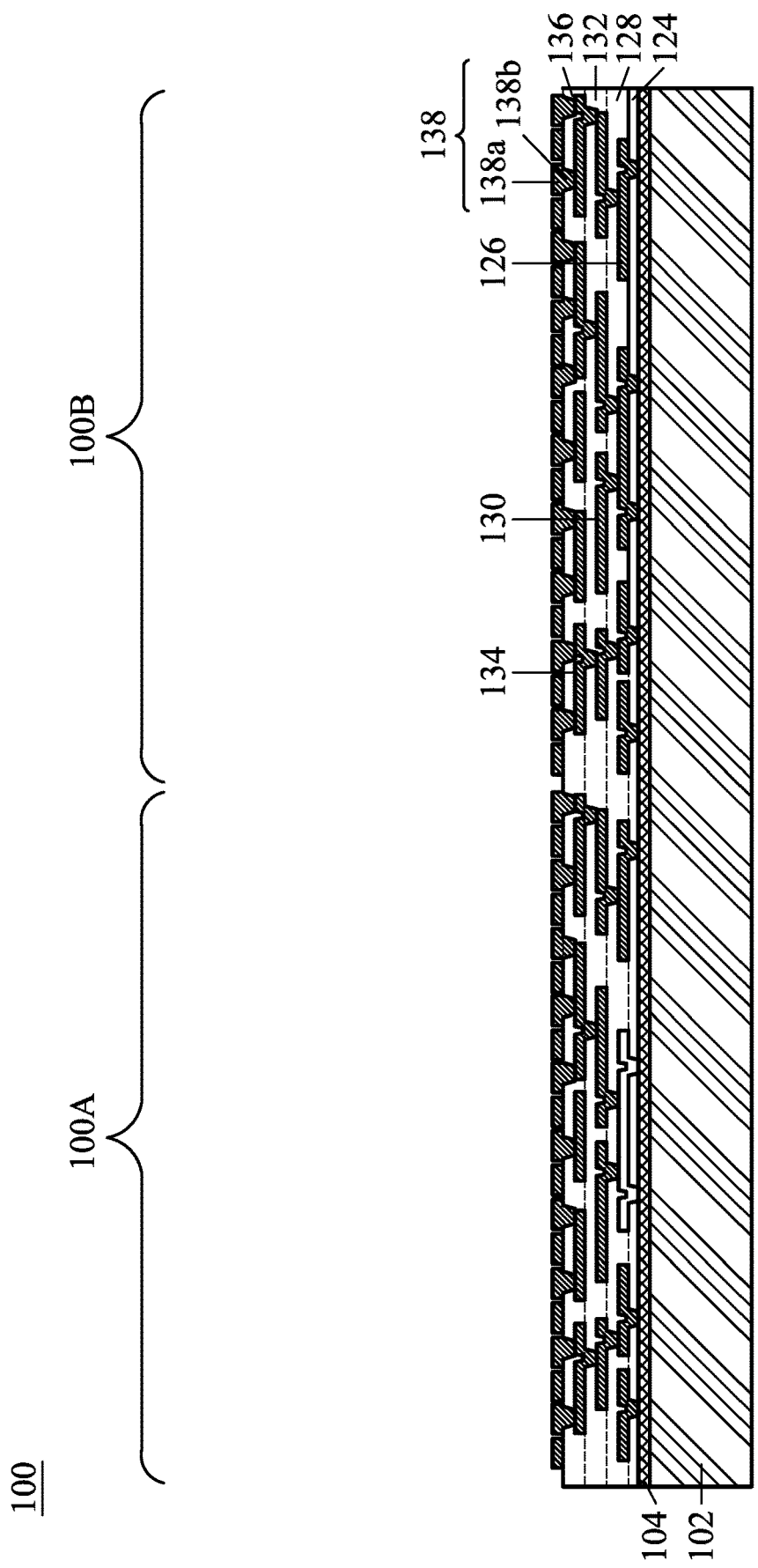

In FIG. 6, the dielectric layer 136 is deposited on the metallization pattern 134 and the dielectric layer 132. The dielectric layer 136 may be formed in a manner similar to the dielectric layer 124, and may be formed of a similar material as the dielectric layer 124.

The metallization pattern 138 is then formed. The metallization pattern 138 includes portions 138a (including portions 138a1, 138a2, and 138a3 as discussed below in FIGS. 9A and 9B) on and extending along the major surface of the dielectric layer 132. The metallization pattern 138 further includes portions 138b extending through the dielectric layer 136 to physically and electrically couple the metallization pattern 134. The metallization pattern 138 may be formed in a similar manner and of a similar material as the metallization pattern 126. The metallization pattern 138 is the topmost metallization pattern of the redistribution structure 120. In some embodiments, the metallization pattern 138 has a different shape than the metallization patterns 126, 130, and 134. For example, the portions 138a of the metallization patterns 138 may be formed in a curved, C"-like or "U"-like shape in a plan view that can flex and deform without breaking (see FIGS. 8, 9A, and 9B) as discussed below. Further, the metallization patterns 134, 130, and 126 may be formed to a greater pitch than the metallization pattern 138.

Figure 7:
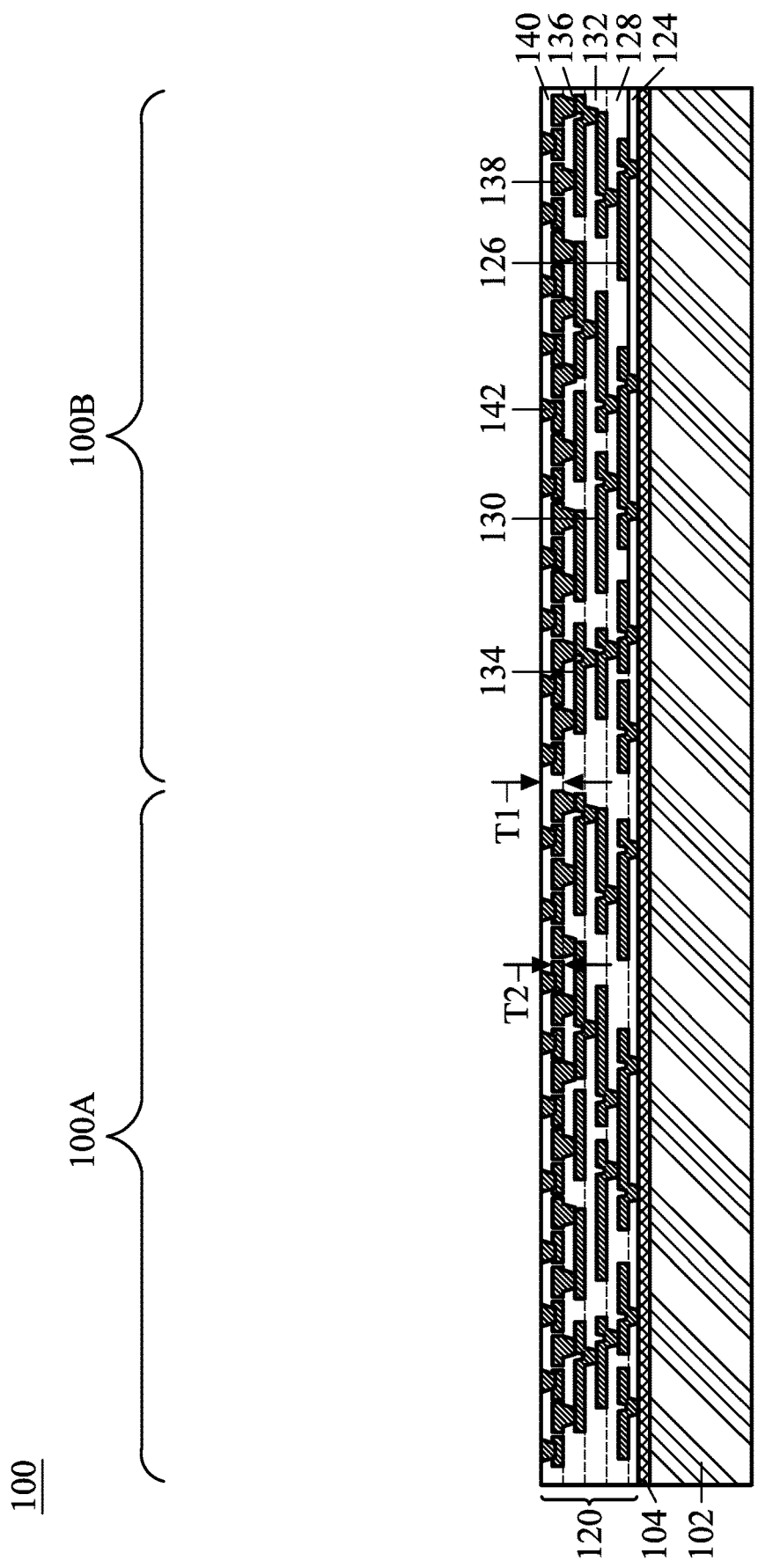

In FIG. 7, the dielectric layer 140 is deposited on the metallization pattern 138 and the dielectric layer 136. The dielectric layer 140 may be formed in a manner similar to the dielectric layer 124, and may be formed of a similar material as the dielectric layer 124. The dielectric layer 140 is then patterned. The patterning forms openings exposing portions of the metallization pattern 138. The patterning may be by an acceptable process, such as by exposing and developing the dielectric layer 140 to light when the dielectric layer 140 is a photo-sensitive material or by etching using, for example, an anisotropic etch.

The dielectric layer 140 has a thickness T1 and the conductive features of the metallization pattern 138 has a thickness T2. In some embodiments, the thickness T1 of the dielectric layer 140 is greater than the thickness T2 of the metallization pattern 138. In some embodiments, the thickness T1 is in the range of 5 µm to 20 µm. In some embodiments, the thickness T1 is in the range of 5 µm to 8 µm. In some embodiments, the thickness T2 is in the range of 2 μm to 15 μm. In some embodiments, the thickness T2 is in the range of 2 μm to 5 μm.

In some embodiments, the metallization pattern 138 has a different size than the metallization patterns 126, 130, and 134. For example, in some embodiments, the conductive lines and/or vias of the metallization pattern 138 may be wider or thicker than the conductive lines and/or vias of the metallization patterns 126, 130, and 134. In some embodiments, the conductive lines and/or vias of the metallization pattern 138 may be the same width and/or thickness as the conductive lines and/or vias of the metallization patterns 126, 130, and 134.

In some embodiments, the dielectric layer 140 has a different thickness than the dielectric layers 124, 128, 132, and 136. For example, in some embodiments, the dielectric layer 140 may be thicker than the dielectric layers 124, 128, 132, and 136. In some embodiments, the dielectric layer 140 may be the same thickness as the dielectric layers 124, 128, 132, and 136.

Conductive vias 142 are then formed in the openings in the dielectric layer 140 to physically and electrically couple the metallization pattern 138. As an example to form the conductive vias 142, a seed layer is formed in the openings extending through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A conductive material is then formed on the seed layer in the openings. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive vias 142. A planarization process may be performed to form a substantially planar top surface of the dielectric layer 140 and the conductive vias 142. The planarization process may include, for example, a chemical mechanical polish (CMP) process.

Figure 8:
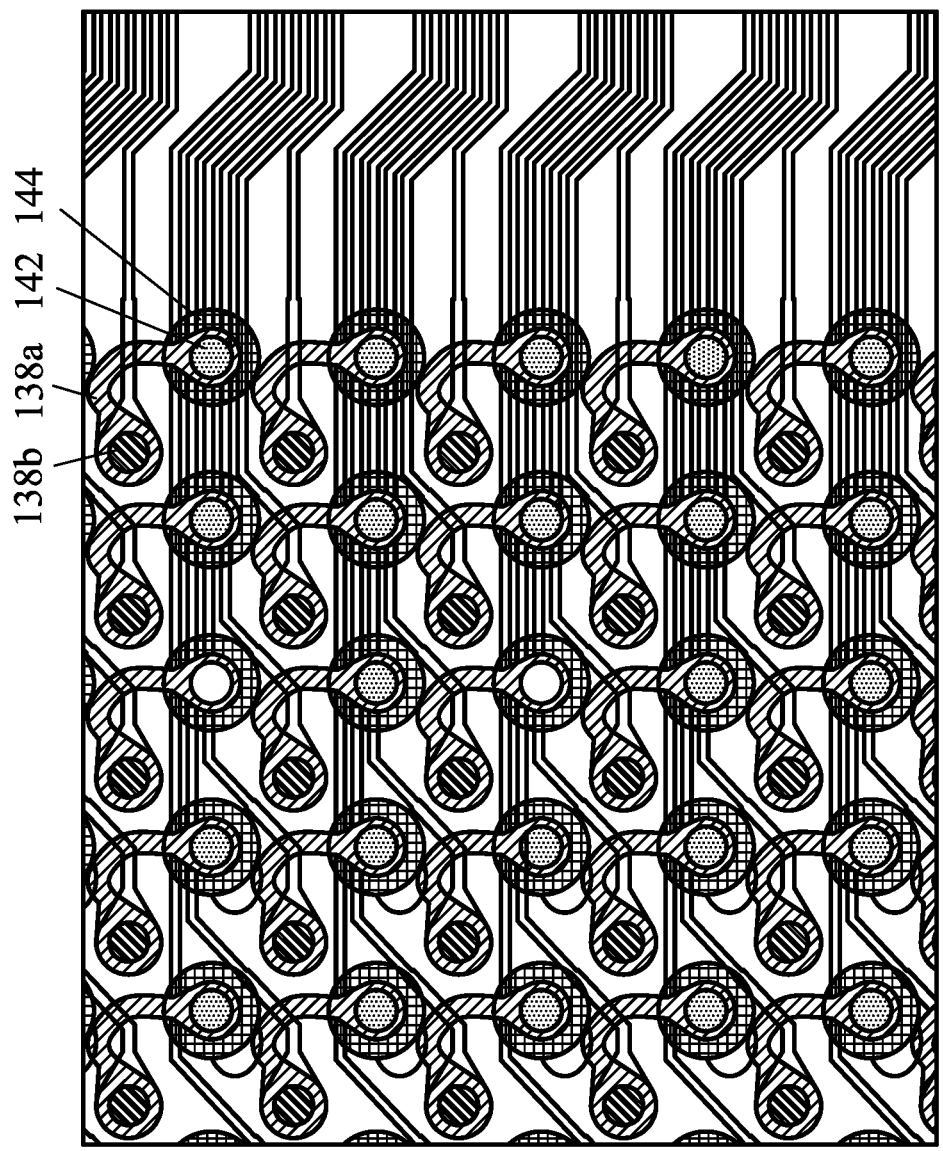
FIG. 8 is a plan view of conductive features in accordance with some embodiments.

FIG. 8 is a plan view of the conductive features of the redistribution structure 120, including the metallization pattern 138 (i.e., portions 138a and 138b), and conductive vias 142. As illustrated in FIG. 8, the portions 138a of the metallization pattern 138 have a curved, "C"-like or "U"-like shape in a plan view in which the portions 138b are located at a first end of the curved shape, and the conductive vias 142 are located at a second end of the curved shape. The curved, "C"-like or "U"-like shape can act like a coil of a spring and flex and deform without breaking. Metallization patterns in redistribution structures may bend or deform due to coefficient of thermal expansion (CTE) mismatch of materials in a semiconductor package. This CTE mismatch can cause the metallization patterns to endure high stress due to the bending and deformation. However, the disclosed shapes of the metallization patterns with the increased flexibility increase the reliability of the redistribution structure. The flexibly-shaped metallization pattern 138 and the flexible dielectric layer 140 may be referred to as stress buffer films as they provide a buffer to safely release the stress in the redistribution structure and the package structure.

Figure 9A:
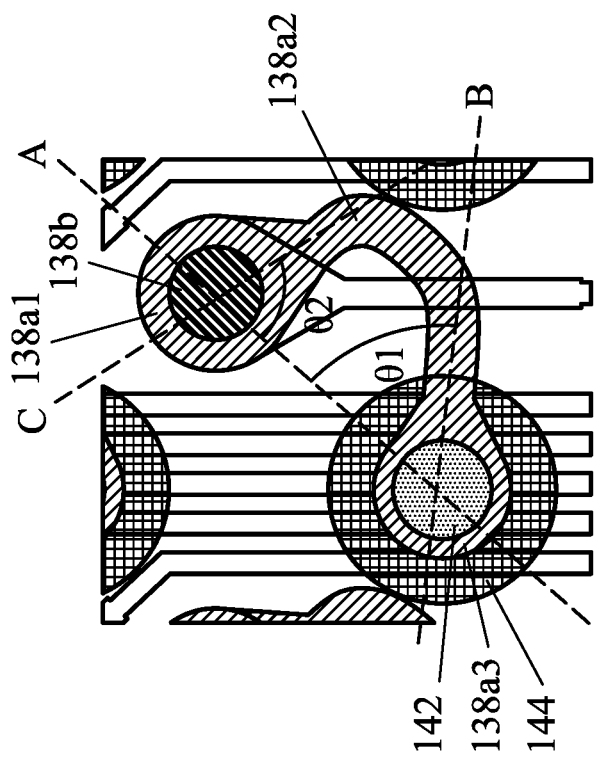
FIGS. 9A and 9B are detailed plan views of conductive features illustrated in FIG. 8 in accordance with some embodiments.

FIG. 9A illustrates a detailed view of a "C"-like conductive feature of the metallization pattern 138 from FIG. 8. The portion 138a has a first portion 138a1 directly over via portion 138b, a second portion 138a2 that extends from the first portion 138a1, and a third portion 138a3 that is directly under the conductive via 142. The first and third portions 138a1 and 138a3 are the pad portions that are coupled to the overlying and underlying vias 138 and 142, and the second portion 138a2 has a curved or detour pattern and connects the first and third portions 138a1 and 138a3. The detour pattern of the second portion 138a2 helps the conductive features of the metallization pattern 138 to safely release the stress in the redistribution structure and/or the package structure.

In some embodiments, the pad portions 138a1 and 138a3 are wider, in a plan view, than the curved portion 138a2. This allows for the pad portions 138a1 and 138a3 to make better connections to the overlying and underlying vias and to improve the reliability of the redistribution structure.

As illustrated in FIG. 9A, a line A goes through the a center of the conductive via 142 and a center of the portion 138B of the single conductive feature of the metallization pattern 138 electrically coupled to the conductive via 142 by the portion 138a of the same conductive feature of metallization pattern 138. Line B extends from the center of the same conductive via 142 along a center of a first line segment of the portion 138a2 of the same conductive feature of the metallization pattern extending from the conductive via 142. Line C extends from the center of the same portion 138a of the same conductive feature of metallization pattern 138 along a center of a first line segment of the portion 138a2 of the same conductive feature of the metallization pattern extending from the via portion 138b.

In some embodiments, the lines A, B, and C are parallel to a major surface of the dielectric layer 140. An angle θ1 is between the line A and the line B. In some embodiments, the angle θ1 is in the range of 30° to 150°. In some embodiments, the angle θ1 is in the range of 30° to 90°. In some embodiments, the angle θ1 is in the range of 40° to 50°. An angle θ2 is between the line A and the line C. In some embodiments, the angle θ2 is in the range of 30° to 150°. In some embodiments, the angle θ2 is in the range of 30° to 90°. In some embodiments, the angle θ2 is in the range of 40° to 50°. In some embodiments, the angles θ1 and θ2 are the same. In some other embodiments, the angles θ1 and θ2 are different. In some embodiments, the conductive line portions 138a2 of the metallization pattern 138 is curved and does not include any sharp corners or sudden changes in direction. For example, the conductive line portions 138a2 in a plan view slowly change directions by utilizing arcs but have no corners, such as 90° corners, with sudden changes in directions. In some embodiments, the disclosed stress relieving metallization patterns 138 and the dielectric layer 140 can reduce the stress on underlying metallization patterns (e.g., metallization pattern 134) in a range from 15% to 35%, such as 30%.

Figure 9B:
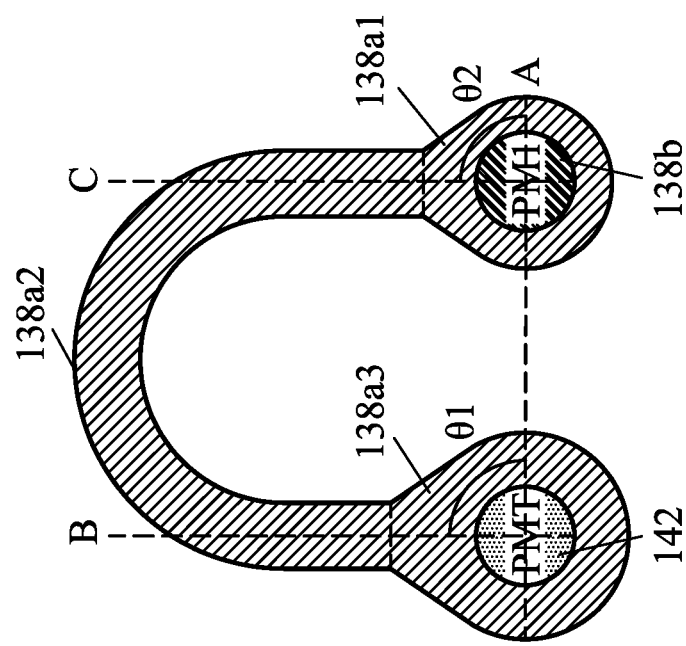

FIG. 9B illustrates a detailed view of a "U"-like conductive feature of the metallization pattern 138 from FIG. 8. The major components of the "U"-like conductive feature (e.g., portions 138a1, 138a2, 138a3, θ1, and θ2 were previously described in FIG. 9A and the description is not repeated herein In some embodiments, each of the conductive features of the metallization pattern 138 on the first package component 100 have a same shape and each are oriented in a same direction such that each of their lines A are parallel, each of their lines B are parallel, and each of their lines C are parallel (see, e.g., metallization patterns in FIG. 8). In some embodiments, the conductive features of the metallization pattern 138 have different shapes are oriented differently such that their lines A are not parallel, their lines B are not parallel, and/or their lines C are not parallel. In some embodiments, the conductive features of the metallization pattern 138 are all "C"-like shape, all "U"-like shape, or are mix of "C"-like and "U"-like shapes.

Although the angles θ1 and θ2 were described using lines A, B, and C, the lines A, B, and C could be replaced by planes A, B, and C, where the planes A, B, and C are perpendicular to the major surface of the dielectric layer 140.

Figure 10:
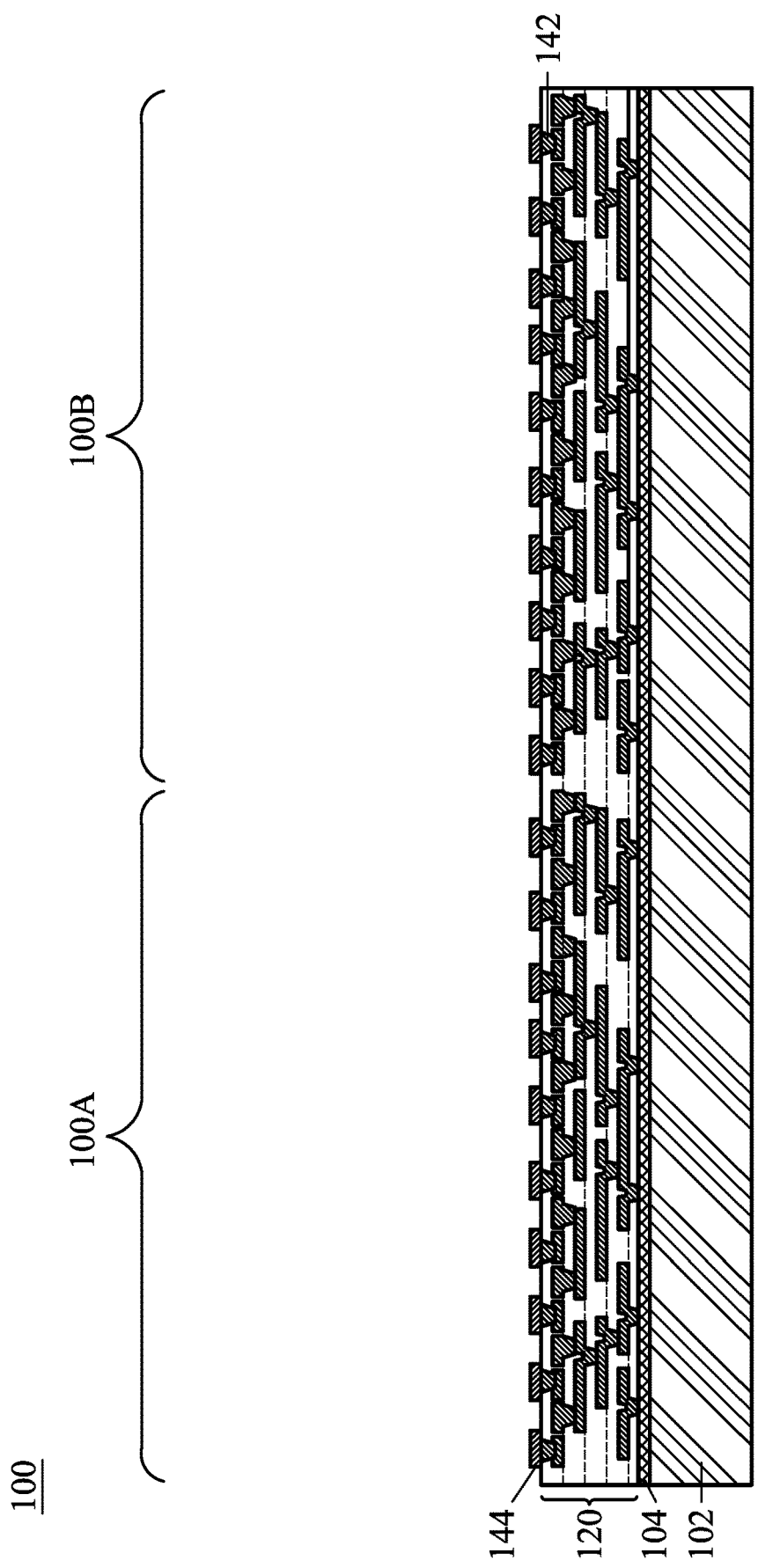

In FIG. 10, under-bump metallurgies (UBMs) 144 are formed for external connection to the conductive vias 142. The UBMs 144 may be referred to as pads 144. The UBMs 144 have bump portions on and extending along the major surface of the dielectric layer 140 and physically and electrically couple the conductive vias 142. The UBMs 144 may be formed of the same material as the conductive vias 142. In some embodiments, the UBMs 144 have a different size than the metallization patterns 126, 130, 134, and 138.

As an example, the UBMs 144 may be formed by first forming a seed layer over the dielectric layer 140 and the conductive vias 142. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 144. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. In some embodiments, the UBMs 144 may comprise alloys such as electroless nickel, electroless palladium, immersion gold (ENEPIG), electroless nickel, immersion gold (ENIG), or the like. The combination of the conductive material and underlying portions of the seed layer form the UBMs 144. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching.

Figure 11:
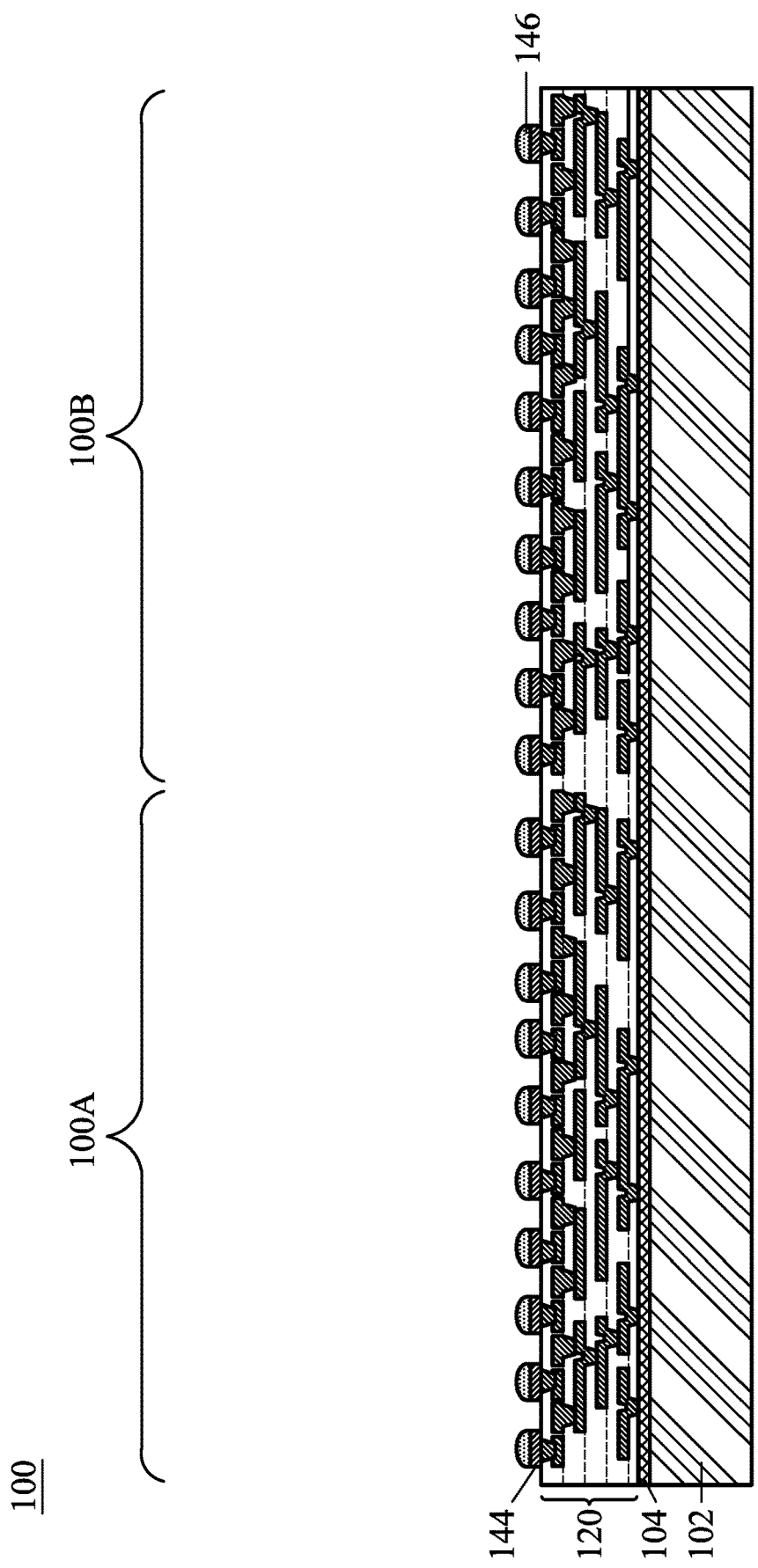

In FIG. 11, conductive connectors 146 are formed on the UBMs 144. The conductive connectors 146 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 146 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 12:
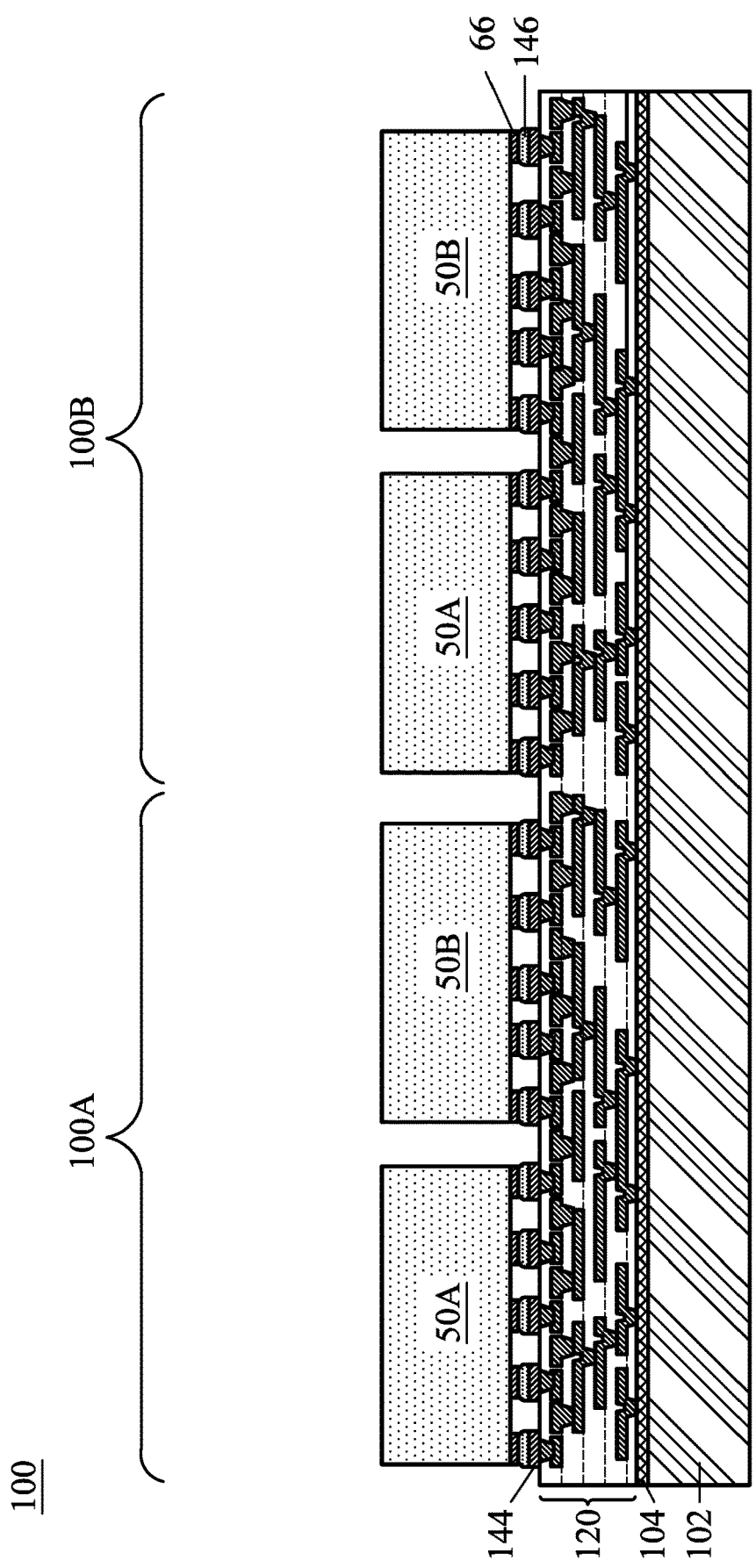

In FIG. 12, integrated circuit dies 50 (e.g., first integrated circuit dies 50A and second integrated circuit dies 50B) are attached to the structure of FIG. 11. A desired type and quantity of integrated circuit dies 50 are adhered in each of the package regions 100A and 100B. The integrated circuit dies 50 may be referred to as package modules 50. In the embodiment shown, multiple integrated circuit dies 50 are adhered adjacent one another, including the first integrated circuit die 50A and the second integrated circuit die 50B in each of the first package region 100A and the second package region 100B. The first integrated circuit die 50A may be a logic device, such as a central processing unit (CPU), a graphics processing unit (GPU), a system-on-a-chip (SoC), a microcontroller, or the like. The second integrated circuit die 50B may be a memory device, such as a dynamic random access memory (DRAM) die, a static random access memory (SRAM) die, a hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas).

The integrated circuit dies 50 are attached to the conductive connectors 146. That is, the die connectors 66 of the integrated circuit dies 50A and 50B are connected to the conductive connectors 146 opposite the UBMs 144.

In some embodiments, the conductive connectors 146 are reflowed to attach the integrated circuit dies 50 to the UBMs 144. The conductive connectors 146 electrically and/or physically couple the redistribution structure 120, including metallization patterns in the redistribution structure 120, to the integrated circuit dies 50. In some embodiments, a solder resist (not shown) is formed on the redistribution structure 120. The conductive connectors 146 may be disposed in openings in the solder resist to be electrically and mechanically coupled to the UBMs 144. The solder resist may be used to protect areas of the redistribution structure 120 from external damage.

The conductive connectors 146 may have an epoxy flux (not shown) formed thereon before they are reflowed with at least some of the epoxy portion of the epoxy flux remaining after the integrated circuit dies 50 are attached to the redistribution structure 120. This remaining epoxy portion may act as an underfill to reduce stress and protect the joints resulting from reflowing the conductive connectors 146.

Figure 13:
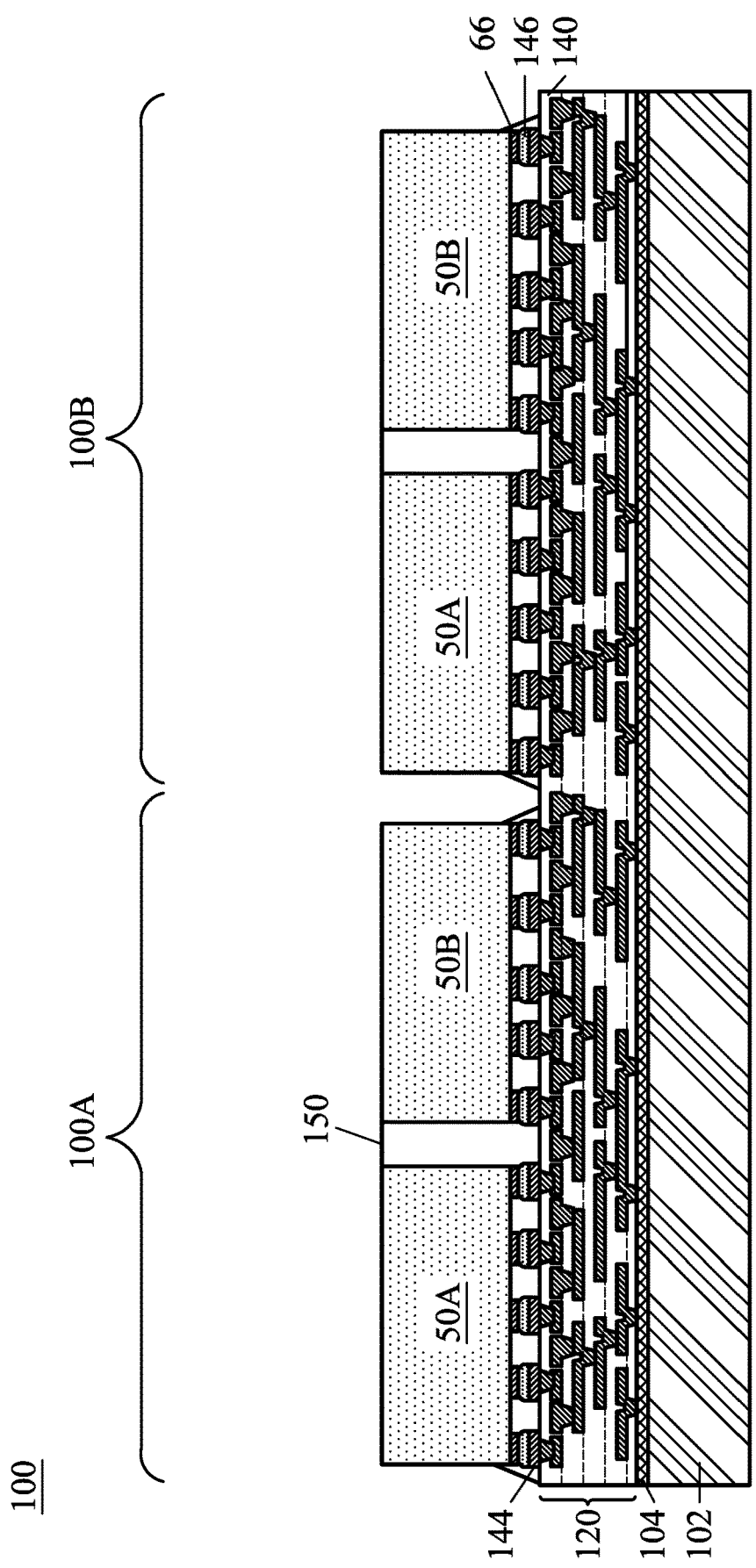

In FIG. 13, an underfill 150 is formed between the integrated circuit dies 50A and 50B in each of the regions 100A and 100B and the dielectric layer 140, including between and around the UBMs 144, the conductive connectors 146, and the die connectors 66. The underfill 150 may be formed by a capillary flow process after the integrated circuit dies 50 are attached or may be formed by a suitable deposition method before the integrated circuit dies 50 are attached. Although not shown in FIG. 13 and subsequent figures, in some embodiments, the underfill 150 is also between the integrated circuit dies 50 in adjacent regions 100A and 100B.

Figure 14:
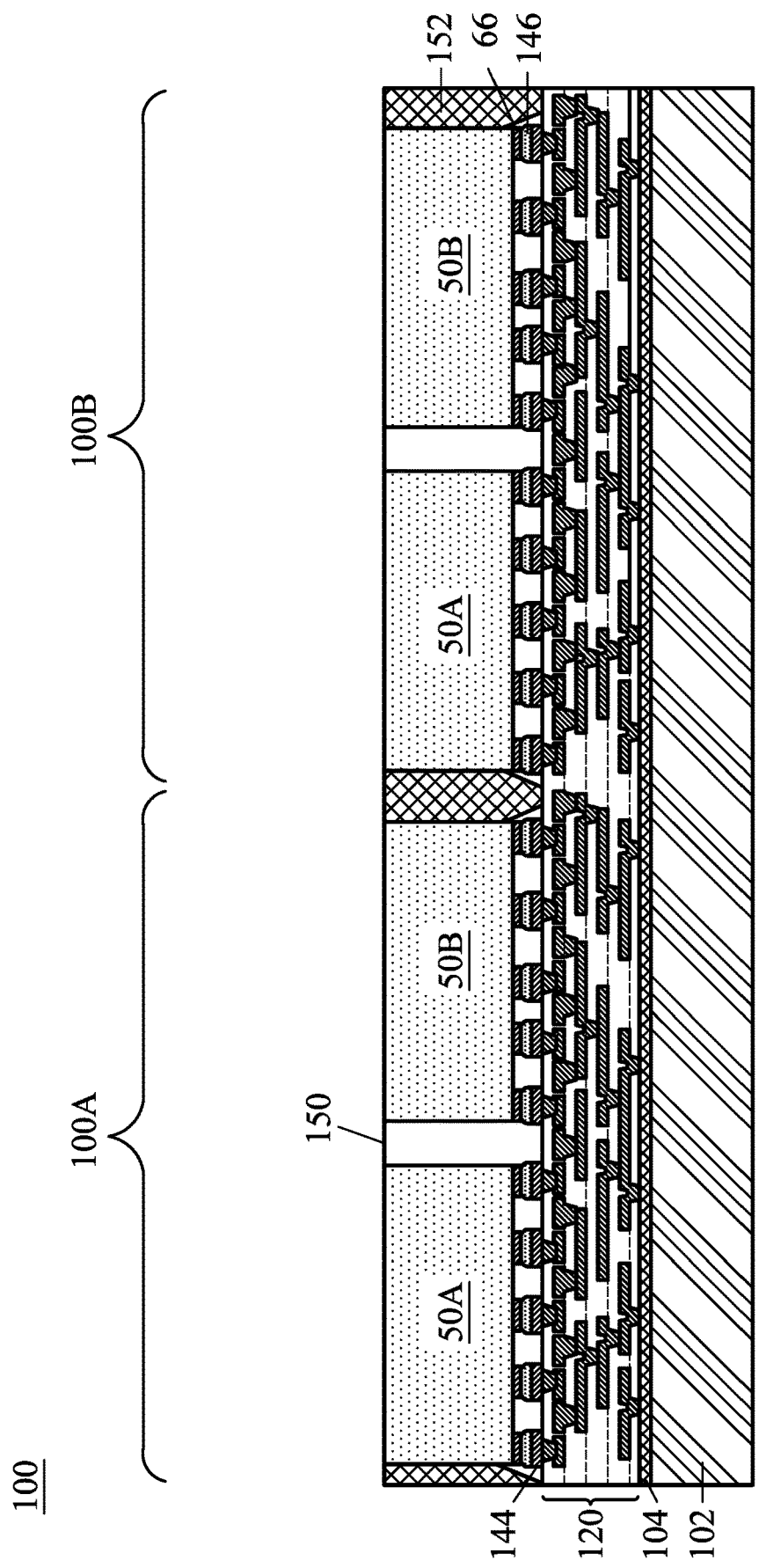

In FIG. 14, an encapsulant 152 is formed around the integrated circuit dies 50, the conductive connectors 146, and the underfill 150. After formation, the encapsulant 152 encapsulates the conductive connectors 146 and the integrated circuit dies 50. The encapsulant 152 may be a molding compound, epoxy, or the like. The encapsulant 152 may be applied by compression molding, transfer molding, or the like. The encapsulant 152 may be applied in liquid or semi-liquid form and then subsequently cured. In some embodiments, a planarization step may be performed to remove and planarize an upper surface of the encapsulant 152. In some embodiments, surfaces of the underfill 150, the encapsulant 152, and the integrated circuits dies 50 are coplanar (within process variation).

Figure 15:
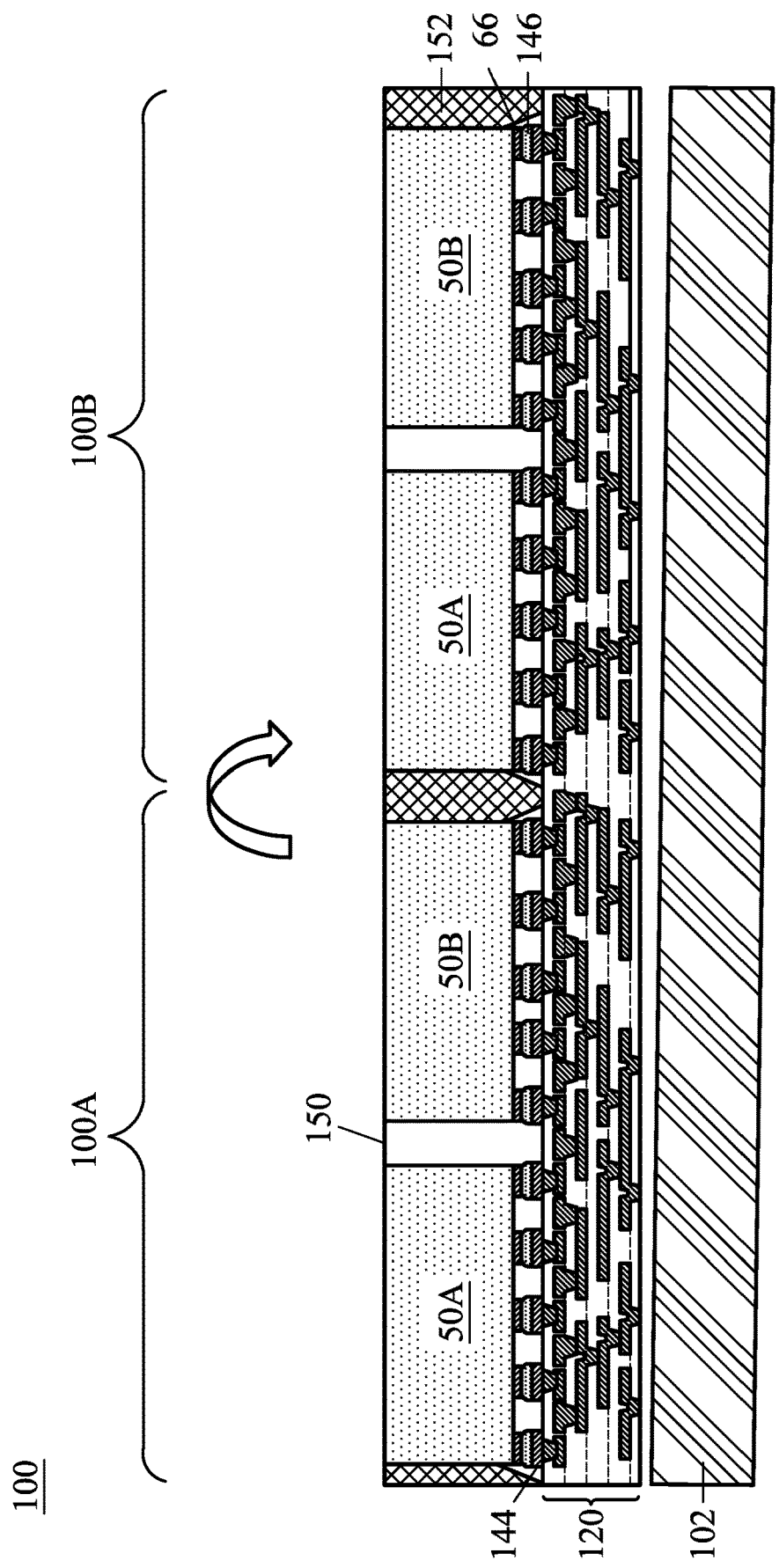

In FIG. 15, a carrier substrate de-bonding is performed to detach (or "de-bond") the carrier substrate 102 from the redistribution structure 120, e.g., the dielectric layer 124. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown).

Figure 16:
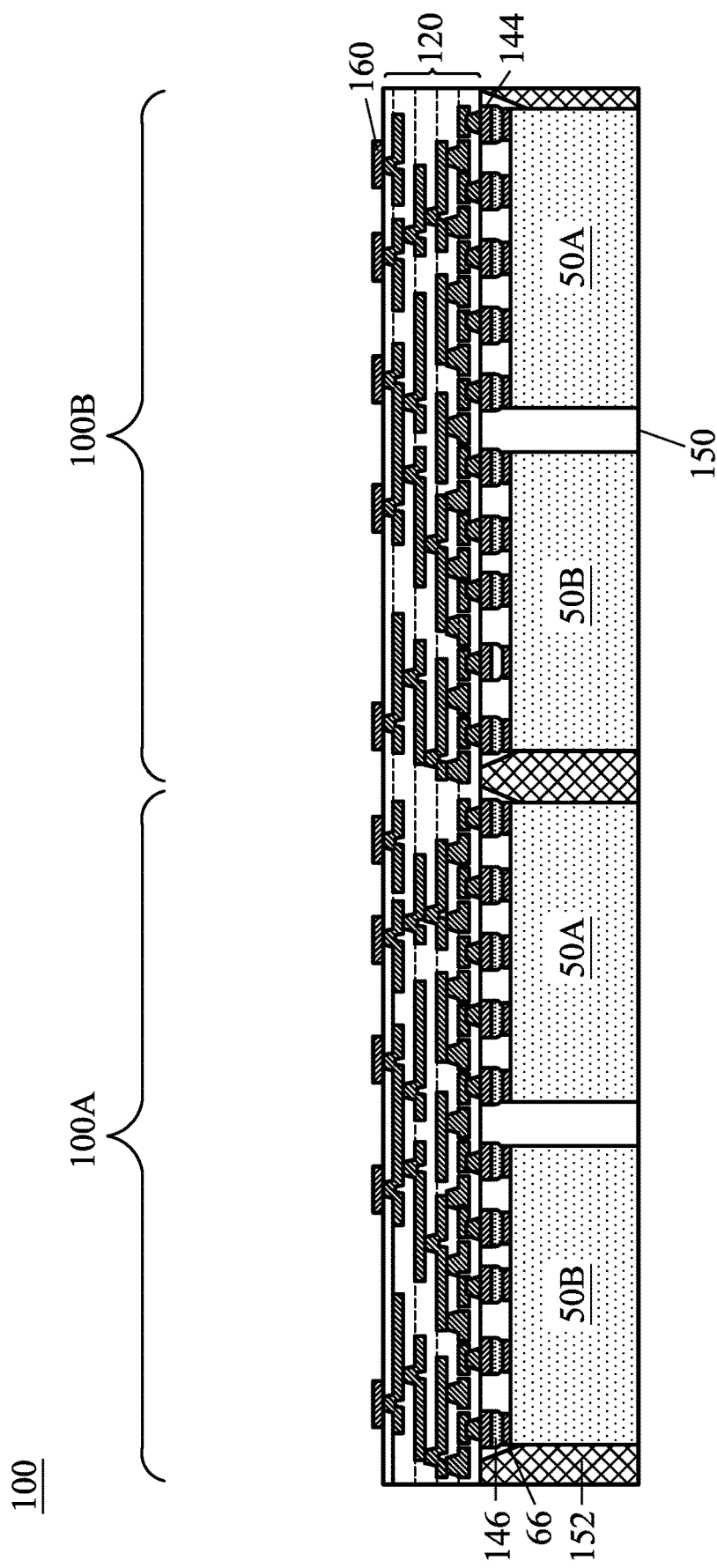

In FIG. 16, UBMs 160 are formed for external connection to the redistribution structure 120, e.g., the metallization pattern 126. The UBMs 160 have bump portions on and extending along the major surface of the dielectric layer 124. The UBMs 160 may be formed of the same material as the metallization pattern 126.

Figure 17:
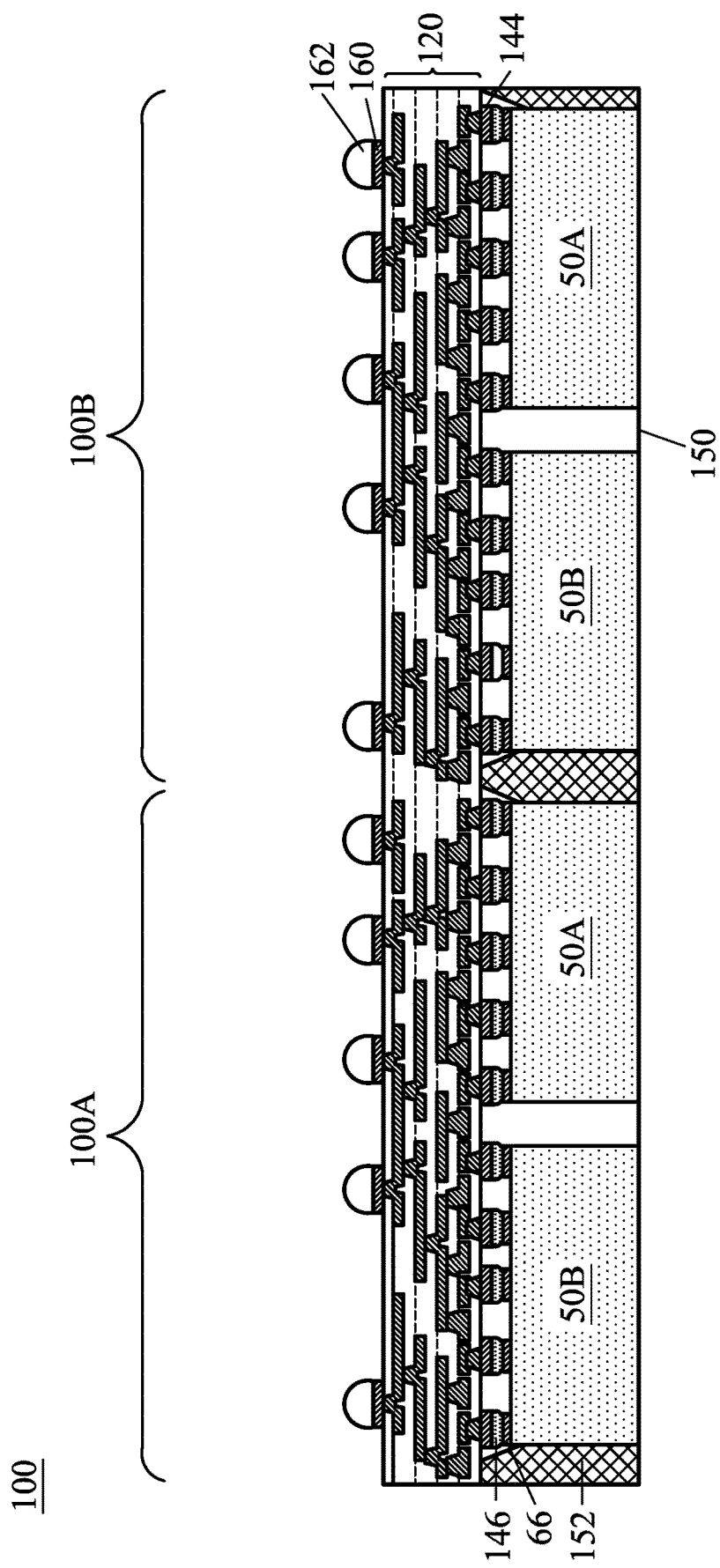

In FIG. 17, conductive connectors 162 are formed on the UBMs 160. The conductive connectors 162 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 162 may include a conductive material such as solder, copper, aluminum, gold, nickel, silver, palladium, tin, the like, or a combination thereof. In some embodiments, the conductive connectors 162 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 162 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 18:
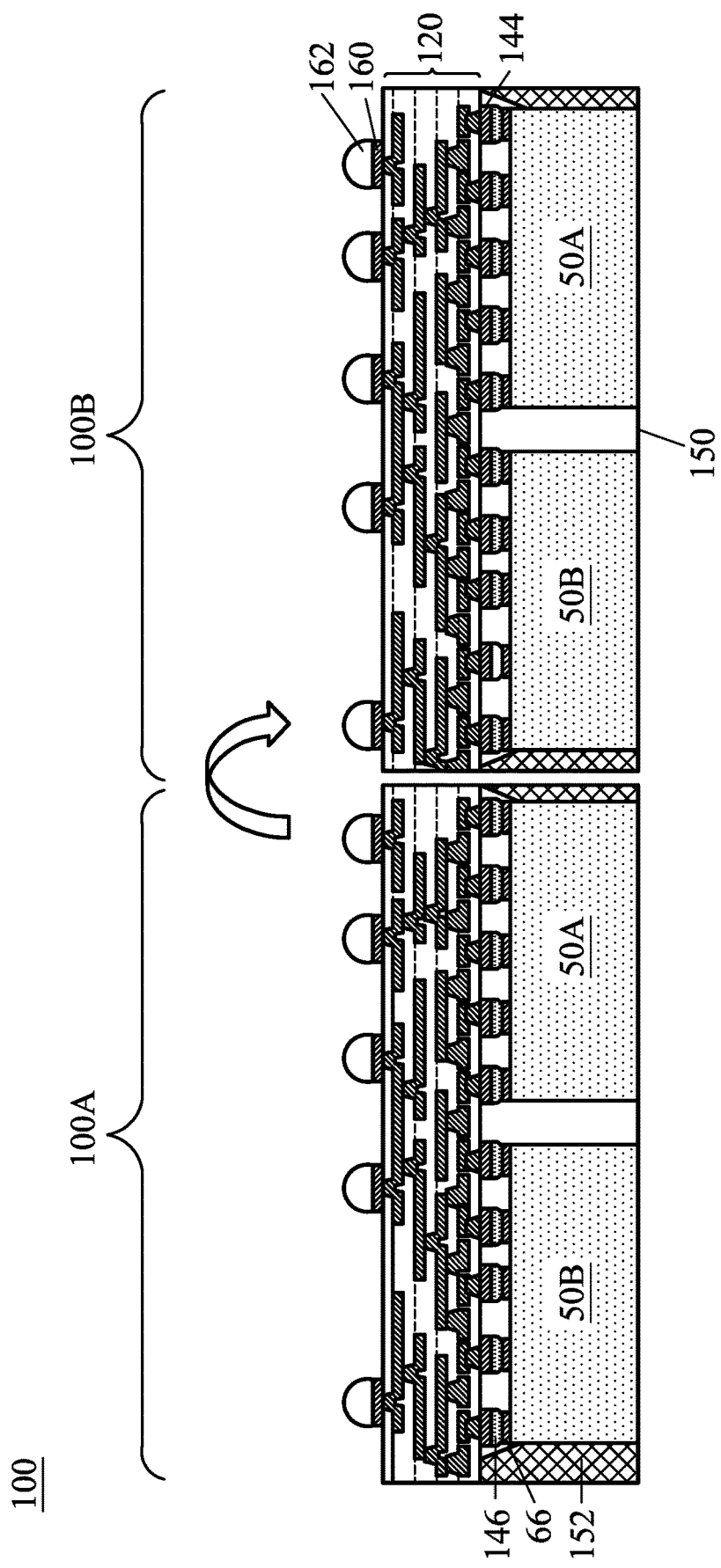

As illustrated in FIG. 18, a singulation process is performed by sawing along scribe line regions, e.g., between the first package region 100A and the second package region 100B. The sawing singulates the first package region 100A from the second package region 100B. The resulting, singulated device stack is from one of the first package region 100A or the second package region 100B. The singulated structures are then each flipped over and mounted on a package substrate 200 (see FIG. 19).

Figure 19:
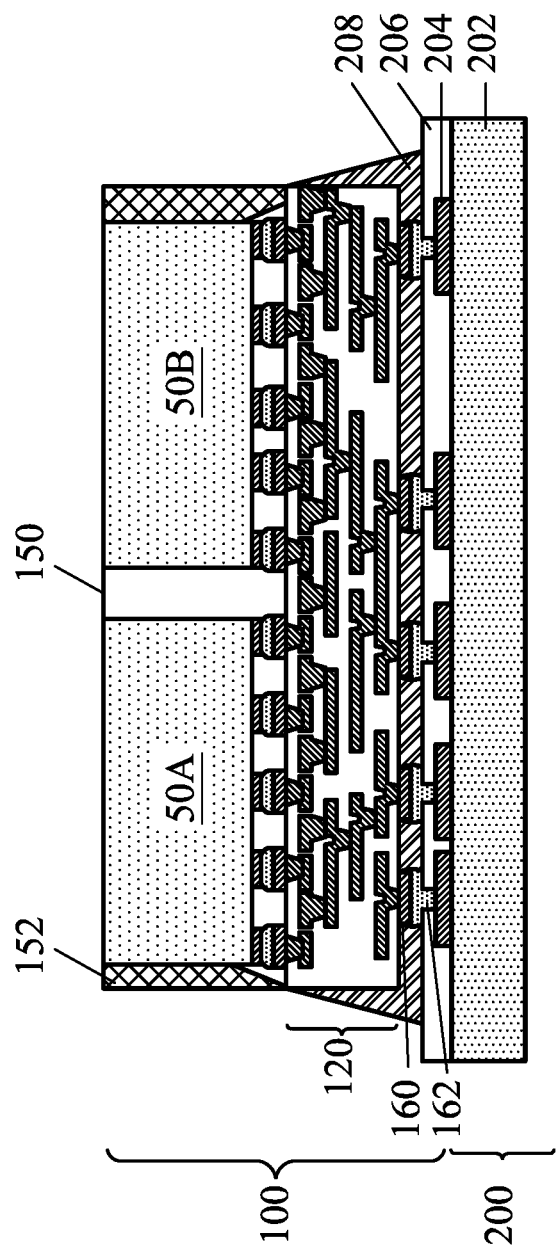
FIG. 19 illustrates a cross-sectional view of formation and implementation of device stacks in accordance with some embodiments.

In FIG. 19, the first package component 100 may be mounted to the package substrate 200 using the conductive connectors 162. The package substrate 200 includes a substrate core 202 and bond pads 204 over the substrate core 202. The substrate core 202 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 202 may be a semiconductor-on-insulator (SOI) substrate. Generally, an SOI substrate includes a layer of a semiconductor material such as epitaxial silicon, germanium, silicon germanium, SOI, SGOI, or combinations thereof. The substrate core 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other PCB materials or films. Build up films such as ABF or other laminates may be used for substrate core 202.

The substrate core 202 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 202 may also include metallization layers and vias (not shown), with the bond pads 204 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 202 is substantially free of active and passive devices.

In some embodiments, the conductive connectors 162 are reflowed to attach the first package component 100 to the bond pads 204. The conductive connectors 162 electrically and/or physically couple the package substrate 200, including metallization layers in the substrate core 202, to the first package component 100. In some embodiments, a solder resist 206 is formed on the substrate core 202. The conductive connectors 162 may be disposed in openings in the solder resist 206 to be electrically and mechanically coupled to the bond pads 204. The solder resist 206 may be used to protect areas of the substrate 202 from external damage.

The conductive connectors 162 may have an epoxy flux (not shown) formed thereon before they are reflowed with at least some of the epoxy portion of the epoxy flux remaining after the first package component 100 is attached to the package substrate 200. This remaining epoxy portion may act as an underfill to reduce stress and protect the joints resulting from reflowing the conductive connectors 162. In some embodiments, an underfill 208 may be formed between the first package component 100 and the package substrate 200 and surrounding the conductive connectors 162. The underfill 208 may be formed by a capillary flow process after the second package component 200 is attached or may be formed by a suitable deposition method before the second package component 200 is attached.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Redistribution structures including metallization patterns, and methods of forming the same are provided, according to some embodiments. In particular, the redistribution structures include the metallization patterns with shapes that provide more flexibility for the metallization pattern to deal with bending and other deformations without breaking. For example, the metallization patterns can have a curved, "C"-like or "U"-like shape. Metallization patterns in redistribution structures may bend or deform due to coefficient of thermal expansion (CTE) mismatch of materials in a semiconductor package. This CTE mismatch can cause the metallization patterns to endure high stress due to the bending and deformation. However, the disclosed shapes of the metallization patterns with the increased flexibility increase the reliability of the redistribution structure. These flexibly-shaped metallization patterns are surrounded by conforming dielectric layers, such as polymer layers. The combination of the flexibly-shaped metallization patterns and the surrounding conforming dielectric layers provide a buffer to release the stress in the redistribution structure and the package structure.

One embodiment includes a first integrated circuit die. The package structure also includes a redistribution structure bonded to the first integrated circuit die, the redistribution structure including a first dielectric layer. The structure also includes a first metallization pattern in the first dielectric layer, the first metallization pattern including a plurality of first conductive features, each of the first conductive features including a first conductive via and a first conductive line, the first conductive via being in the first dielectric layer, the first conductive line being over the first dielectric layer and electrically coupled to the respective first conductive via, each of the first conductive lines including a curve in a plan view. The structure also includes a second dielectric layer over the first dielectric layer and the first metallization pattern. The structure also includes a second metallization pattern in the second dielectric layer, the second metallization pattern including a plurality of second conductive features, each of the second conductive features including a second conductive via in the second dielectric layer, each of the second conductive vias being over and electrically coupled to a respective first conductive line.

Embodiments may include one or more of the following features. The package structure where the second metallization pattern is closer to the first integrated circuit die than the first metallization pattern. The package structure further including a package substrate bonded to a first side of the redistribution structure, the first integrated circuit die being bonded to a second side of the redistribution structure, the first metallization pattern being closer to the first side of the redistribution structure than the second metallization pattern. The package substrate is bonded to the first side of the redistribution structure with a first set of conductive connectors, and where the first integrated circuit die being is bonded to the second side of the redistribution structure with a second set of conductive connectors. The package structure further including an underfill between the first integrated circuit die and the second side of the redistribution structure, the underfill surrounding the second set of conductive connectors an encapsulant on the second side of the redistribution structure and sidewalls of the first integrated circuit die and the underfill. A first angle is between a first plane and a second plane, the first plane and the second plane intersecting a first one of the plurality of first conductive features, the first plane and second plane being perpendicular to a major surface of the second dielectric layer, the first plane extending from a center of a first conductive vias of the first one of the plurality of first conductive features to a center of the second conductive via over and coupled to the first one of the plurality of first conductive features, the second plane extending from the center of the second conductive via over and coupled to the first one of the plurality of first conductive features along a first portion of the first conductive line of the first one of the plurality of first conductive features, the first angle being in a range from 30° to 150°. Each of the first conductive lines of the plurality of first conductive features is free from corners in the plan view. Each of the first conductive lines includes copper and where the second dielectric layer includes a polymer. The second dielectric layer includes polybenzoxazole (PBO), polyimide, or benzocyclobutene (BCB).

One embodiment includes a first package component including a first module and a second module, the first module including a logic chip, the second module including a memory chip. The package structure also includes a first redistribution structure including metallization patterns in dielectric layers, a first side of the first redistribution structure being physically and electrically coupled to the first and second modules, a first metallization pattern of the metallization patterns being in a first dielectric layer of the dielectric layers, the first metallization pattern including first conductive features, each of the first conductive features including a first conductive via and a first conductive line, the first conductive via being in the first dielectric layer, the first conductive line being over the first dielectric layer and electrically coupled to the respective first conductive via, each of the first conductive lines being curved and free of corners in a plan view. The structure also includes a second package component including a package substrate bonded to a second side of the first redistribution structure, the second side being opposite the first side.

Embodiments may include one or more of the following features. The package structure where the first redistribution structure further includes a second dielectric layer over the first dielectric layer and the first metallization pattern a second metallization pattern in the second dielectric layer, the second metallization pattern including second conductive features, each of the second conductive features including a second conductive via in the second dielectric layer, each of the second conductive vias being over and electrically coupled to a respective first conductive line. The first conductive line directly connects the first conductive via to the second conductive via. The second metallization pattern is closer to the first and second modules than the first metallization pattern. Each of the first conductive lines includes copper and where the second dielectric layer includes a polymer. The first package component further includes an underfill between the first module, the second module, and the first side of the first redistribution structure, the underfill extending along first sidewalls of the first and second modules, the first sidewalls of the first and second module facing each other an encapsulant on the first side of the first redistribution structure and on second sidewalls of the first and second modules, the second sidewalls of the first and second modules facing away from each other. Top surfaces of the first module, the second module, the underfill, and the encapsulant are coplanar.

One embodiment includes forming a first dielectric layer over a substrate. The method also includes patterning the first dielectric layer. The method also includes forming a first metallization pattern in and along an upper surface of the patterned first dielectric layer, the first metallization pattern including first conductive features, each of the first conductive features including a first conductive via and a first conductive line, the first conductive via being in the first dielectric layer, the first conductive line being along the upper surface of the first dielectric layer and electrically coupled to the respective first conductive via, each of the first conductive lines being curved and free of corners in a plan view. The method also includes forming a second dielectric layer over the patterned first dielectric layer and the first metallization pattern. The method also includes patterning the second dielectric layer. The method also includes forming a second metallization pattern in the patterned second dielectric layer, the second metallization pattern including second conductive vias in the second dielectric layer, each of the second conductive vias being electrically coupled to a respective first conductive line of the first conductive features.

Embodiments may include one or more of the following features. The method further including forming bond pads over the second dielectric layer and the second metallization pattern, the bond pads being coupled to the second conductive vias bonding a first module and a second module to the bond pads, the first module including a logic chip, the second module including a memory chip encapsulating the first and second modules in an encapsulant removing the substrate and singulating the encapsulant, the first and second metallization patterns, and the first and second dielectric layers. The method further including after singulating, bonding the singulated structure to a package substrate, the package substrate being on an opposite side of the first and second metallization patterns and the first and second dielectric layers as the first and second modules. Each of the first conductive lines includes copper and where the second dielectric layer includes a polymer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure comprising:
a first integrated circuit die;
a redistribution structure bonded to the first integrated circuit die, the redistribution structure comprising:
  a first dielectric layer;
  a first metallization pattern in the first dielectric layer, the first metallization pattern comprising a plurality of first conductive features, each of the first conductive features comprising a first conductive via and a first conductive line, the first conductive via being in the first dielectric layer, the first conductive line being over the first dielectric layer and electrically coupled to the respective first conductive via, each of the first conductive lines comprising a curve in a plan view;
  a second dielectric layer over the first dielectric layer and the first metallization pattern; and
  a second metallization pattern in the second dielectric layer, the second metallization pattern comprising a plurality of second conductive features, each of the second conductive features comprising a second conductive via in the second dielectric layer, each of the second conductive vias being over and electrically coupled to a respective first conductive line.

2. The package structure of claim 1, wherein the second metallization pattern is closer to the first integrated circuit die than the first metallization pattern.

3. The package structure of claim 1 further comprising:
a package substrate bonded to a first side of the redistribution structure, the first integrated circuit die being bonded to a second side of the redistribution structure, the first metallization pattern being closer to the first side of the redistribution structure than the second metallization pattern.

4. The package structure of claim 3, wherein the package substrate is bonded to the first side of the redistribution structure with a first set of conductive connectors, and wherein the first integrated circuit die being is bonded to the second side of the redistribution structure with a second set of conductive connectors.

5. The package structure of claim 4 further comprising:
an underfill between the first integrated circuit die and the second side of the redistribution structure, the underfill surrounding the second set of conductive connectors; and
an encapsulant on the second side of the redistribution structure and sidewalls of the first integrated circuit die and the underfill.

6. The package structure of claim 1, wherein a first angle is between a first plane and a second plane, the first plane and the second plane intersecting a first one of the plurality of first conductive features, the first plane and second plane being perpendicular to a major surface of the second dielectric layer, the first plane extending from a center of a first conductive vias of the first one of the plurality of first conductive features to a center of the second conductive via over and coupled to the first one of the plurality of first conductive features, the second plane extending from the center of the second conductive via over and coupled to the first one of the plurality of first conductive features along a first portion of the first conductive line of the first one of the plurality of first conductive features, the first angle being in a range from 30° to 150°.

7. The package structure of claim 1, wherein each of the first conductive lines of the plurality of first conductive features is free from corners in the plan view.

8. The package structure of claim 1, wherein each of the first conductive lines comprise copper and wherein the second dielectric layer comprises a polymer.

9. The package structure of claim 8, wherein the second dielectric layer comprises polybenzoxazole (PBO), polyimide, or benzocyclobutene (BCB).

10. A package structure comprising:
a first package component comprising:
- a first module and a second module, the first module comprising a logic chip, the second module comprising a memory chip; and
- a first redistribution structure comprising metallization patterns in dielectric layers, a first side of the first redistribution structure being physically and electrically coupled to the first and second modules, a first metallization pattern of the metallization patterns being in a first dielectric layer of the dielectric layers, the first metallization pattern comprising first conductive features, each of the first conductive features comprising a first conductive via and a first conductive line, the first conductive via being in the first dielectric layer, the first conductive line being over the first dielectric layer and electrically coupled to the respective first conductive via, each of the first conductive lines being curved and free of corners in a plan view; and a second package component comprising:
- a package substrate bonded to a second side of the first redistribution structure, the second side being opposite the first side.

11. The package structure of claim 10, wherein the first redistribution structure further comprises:
- a second dielectric layer over the first dielectric layer and the first metallization pattern; and
- a second metallization pattern in the second dielectric layer, the second metallization pattern comprising second conductive features, each of the second conductive features comprising a second conductive via in the second dielectric layer, each of the second conductive vias being over and electrically coupled to a respective first conductive line.

12. The package structure of claim 11, wherein the first conductive line directly connects the first conductive via to the second conductive via.

13. The package structure of claim 11, wherein the second metallization pattern is closer to the first and second modules than the first metallization pattern.

14. The package structure of claim 11, wherein each of the first conductive lines comprise copper and wherein the second dielectric layer comprises a polymer.

15. The package structure of claim 10, wherein the first package component further comprises:
- an underfill between the first module, the second module, and the first side of the first redistribution structure, the underfill extending along first sidewalls of the first and second modules, the first sidewalls of the first and second module facing each other; and
- an encapsulant on the first side of the first redistribution structure and on second sidewalls of the first and second modules, the second sidewalls of the first and second modules facing away from each other.

16. The package structure of claim 15, wherein top surfaces of the first module, the second module, the underfill, and the encapsulant are coplanar.

17. A method comprising:
forming a first dielectric layer over a substrate;
patterning the first dielectric layer;
forming a first metallization pattern in and along an upper surface of the patterned first dielectric layer, the first metallization pattern comprising first conductive features, each of the first conductive features comprising a first conductive via and a first conductive line, the first conductive via being in the first dielectric layer, the first conductive line being along the upper surface of the first dielectric layer and electrically coupled to the respective first conductive via, each of the first conductive lines being curved and free of corners in a plan view;
forming a second dielectric layer over the patterned first dielectric layer and the first metallization pattern;
patterning the second dielectric layer; and
forming a second metallization pattern in the patterned second dielectric layer, the second metallization pattern comprising second conductive vias in the second dielectric layer, each of the second conductive vias being electrically coupled to a respective first conductive line of the first conductive features.

18. The method of claim 17 further comprising:
forming bond pads over the second dielectric layer and the second metallization pattern, the bond pads being coupled to the second conductive vias;
bonding a first module and a second module to the bond pads, the first module comprising a logic chip, the second module comprising a memory chip;
encapsulating the first and second modules in an encapsulant;
removing the substrate; and
singulating the encapsulant, the first and second metallization patterns, and the first and second dielectric layers.

19. The method of claim 18 further comprising:
after singulating, bonding the singulated structure to a package substrate, the package substrate being on an opposite side of the first and second metallization patterns and the first and second dielectric layers as the first and second modules.

20. The method of claim 17, wherein each of the first conductive lines comprise copper and wherein the second dielectric layer comprises a polymer.

* * * * *